(12) United States Patent
Miyazaki

(10) Patent No.: US 8,653,476 B2
(45) Date of Patent: Feb. 18, 2014

(54) SPECIMEN HOLDER AND SPECIMEN HOLDER MOVEMENT DEVICE

(76) Inventor: Hiroya Miyazaki, Umi-machi (JP)

( * ) Notice: Subject to any disclaimer, the term of this patent is extended or adjusted under 35 U.S.C. 154(b) by 82 days.

(21) Appl. No.: 13/047,018

(22) Filed: Mar. 14, 2011

(65) Prior Publication Data

US 2011/0240881 A1  Oct. 6, 2011

(30) Foreign Application Priority Data

Mar. 30, 2010 (JP) ................................. 2010-077354

(51) Int. Cl.
*G21K 5/08* (2006.01)
(52) U.S. Cl.
USPC ................................. 250/440.11; 250/442.11
(58) Field of Classification Search
USPC ............ 250/306, 307, 309, 310, 311, 440.11, 250/442.11, 396 R, 397, 398, 400, 492.3, 250/526
See application file for complete search history.

(56) References Cited

U.S. PATENT DOCUMENTS

| | | | | |
|---|---|---|---|---|
| 4,703,181 A * | 10/1987 | Swann et al. | ............. | 250/442.11 |
| 4,947,042 A * | 8/1990 | Nishioka et al. | ................. | 850/26 |
| 5,744,800 A * | 4/1998 | Kakibayashi et al. | ......... | 250/311 |
| 7,238,953 B2 * | 7/2007 | Zandbergen | .............. | 250/440.11 |
| 7,498,589 B2 * | 3/2009 | Maruyama et al. | ....... | 250/442.11 |
| 8,148,700 B2 * | 4/2012 | Miyazaki | .................. | 250/442.11 |
| 2006/0097162 A1* | 5/2006 | Maruyama et al. | ............ | 250/309 |
| 2006/0097187 A1* | 5/2006 | Zandbergen | .............. | 250/440.11 |
| 2010/0006771 A1* | 1/2010 | Miyazaki | .................. | 250/442.11 |
| 2011/0079710 A1* | 4/2011 | Damiano et al. | .............. | 250/307 |

FOREIGN PATENT DOCUMENTS

| | | |
|---|---|---|
| JP | A-2003-068240 | 3/2003 |
| JP | A-2003-149185 | 5/2003 |
| JP | A-2003-282019 | 10/2003 |
| JP | 2007-179805 A | 7/2007 |
| JP | A-2009-222427 | 10/2009 |

OTHER PUBLICATIONS

Tungsten-Alloy.pdf, <http://www.plansee.com/en/Materials-Tungsten-403.htm>, Aug. 26, 2012.*
Chronological Table of Natural Science, National Astronomical Observatory, pp. 395-399, 2006.

* cited by examiner

*Primary Examiner* — Bernard E Souw
(74) *Attorney, Agent, or Firm* — ALG Intellectual Property, LLC

(57) ABSTRACT

The present disclosure significantly reduces the waiting time from inserting a specimen holder into an electron microscope until high quality data acquisition is possible. Characterizing the present disclosure, it is a specimen holder partly made of low thermal expansion material. The low thermal expansion material can be any of group 4, 5 or 6 in the periodic table of the elements.

8 Claims, 4 Drawing Sheets

SPECIMEN HOLDER AND SPECIMEN HOLDER MOVEMENT DEVICE

TECHNICAL FIELD

The present disclosure relates to a specimen holder and a specimen holder movement device, in particular, a specimen holder and a specimen holder movement device made partly of low thermal expansion coefficient material.

BACKGROUND

When observing a specimen in Transmission Electron Microscopes (Hereinafter referred to as TEM) or Scanning Transmission Electron Microscopes (Hereinafter referred to as STEM) (Moreover, from hereinafter TEM, STEM or similar are referred to as electron microscope.), an any position of specimen desired for observation may be observed by irradiating electrons along the optical axis pass through the electron microscope column to the specimen, thereby obtaining information of a transmission electron as well as other secondary information which can be physically obtained. For example, as the electron microscope, it is known a specimen holder for Transmission Electron Microscopes wherein a specimen holder is for putting the specimen in the position of observation of the Transmission Electron Microscope, comprising a main body of the specimen holder which a first opening having a step inside, a specimen holding member having a second opening located in a central portion for holding the specimen which the step allows to support a part of a peripheral border, thereby being rotatablely housed in the first opening, a cover member having an amorphous material film for coating the second opening except for at least one part of the second opening (patent literature 1).

The function of the electron microscope is further explained here. In the electron microscope, the specimen position relative to the optical axis is controlled by a device for altering the position in three dimensions (this device is generally named goniometer stage hereinafter referred to as goniometer) where the specimen is mounted onto a location for mounting the specimen located in the tip of the specimen holder. The specimen holder is inserted in a portion for inserting the specimen holder incorporated in the gonmeter stage. The electrons are generated in the electron source of the electron microscope and accelerated with a high voltage, the electrons hitting as well as passing through the specimen generates information obtained by the electrons passing the specimen, image information, secondary electrons, reflected electrons which are generated from the specimen and x-rays as well as other information which are physically obtained, thereby these information making it possible to observe a specimen.

An electron microscope is equipped with a goniometer that can hold a specimen holder which is described as follows with aid of figure. At first, construction of an electron microscope column, a goniometer stage and a specimen holder is described as follows with the use of figure. Referring to FIG. 1, a specimen holder 2 and 4 is inserted into pipe 6 for holding the goniometer stage. When a specimen holder is inserted into the goniometer, the X-axis movement mechanism 8, 9, and 10 equipped in the goniometer makes it possible to control the position of the specimen holder along the axis referred to as direction 19, this direction is hereinafter referred to as the X-axis direction. By controlling the position of the specimen holder along the X-axis as described above the field of observation for specimen 1 can be altered relative to the electron beam optical axis passing through intersection of 19 and 20. (hereinafter, it is also referred to as X-axis movement)

PROBLEMS RESOLVED BY DISCLOSURE

However, as explained above and referring to FIG. 1 a specimen holder position in the x-axis is decided by the three items 8, 9 and 10, further the precise position of the specimen 1 is decided by the length of the specimen holder main shaft 2 and where part 3 of the specimen holder touches item 10. (The precise position of specimen 1 depends on the x-driving mechanism 8, 9 and 10 as well as the length of item 2). That is, between point 3 of action of X-axis movement of the specimen holder and position of specimen 1, there is an item 2 which is a part of a main body of the specimen holder (hereinafter, this area of the item 2, namely area between point 3 of action of X-axis movement of the specimen holder and position of specimen 1 is also referred to as X-axis movement remote interval area.). The length of item 2 located between X-axis movement remote interval area is affected by change in temperature; item 2 will expand or contract depending of the temperature for example, along the line with the X-axis. This will then cause a displacement in the x-axis direction of the specimen 1 relative to the intersection of 19 and 20.

Referring to FIG. 1 the position in x-axis of a specimen holder, inserted into item 6, is linked via item 10 meaning item 10 is deciding the desired position of the specimen holder along the x-axis. Since a link item 10 for X-axis movement of the specimen holder is equipped with a pipe 6 for holding the specimen holder, if there is a change in the temperature of the pipe 6 for holding the specimen holder, as a result, point 3 of action of the X-axis movement together with the pipe 6 for holding the specimen holder will expand or contract. This will cause a thermal expansion or thermal contraction affecting the position of the specimen 1 located in the item 2 which is a part of the main body of the specimen holder, relative to the intersection of 19 and 20. Therefore a problem of reaching the desired position of the specimen will be shifted due to thermal expansion or contraction of item 2.

In particular, when practically working with specimens for observation in an electron microscope the specimen is mounted onto the specimen holder before the specimen holder is inserted into the electron microscope. It means that the temperature of the specimen holder is originally equal to the ambient room temperature. Then the specimen holder is inserted into the electron microscope where the ambient temperature is different compared to room temperature. This temperature difference will cause the position in the x-axis direction of the specimen to change until the temperature of the specimen holder equals the ambient temperature inside the electron microscope column.

The electron microscope contains a number of coils end lenses to control the behavior of the electron beam. Although some may be water cooled these coils and lenses dissipate heat causing the temperature inside the electron microscope column (where the specimen holder is inserted) to be higher than outside the electron microscope column. Therefore the temperature of the specimen holder will keep changing after inserting it until the temperature of the specimen holder equals the ambient temperature inside the electron microscope column, thereby it will keep expanding.

That is, during the time that the length of the specimen holder 2 continues to change due to temperature influence causing the position of the specimen 1 to change in the x-direction relative to the intersection of 19 and 20, there is a problem that the operator of the electron microscope needs to wait until shift in the position of the specimen is within acceptable limits. This shift in x-direction may be referred to as specimen drift.

In general, depending on the magnification and desired resolution the time to reach acceptable levels of specimen drift varies. In the case of nanometer level high resolution observations the time for reaching acceptable levels of specimen drift may be several hours because it gives the above problem even if it is a nanometer level of specimen drift.

In addition, the specimen drift is heavily affected by variations of the electron microscope ambient room temperature, since the main body material of the electron microscope expands due to temperature influence. Because of that electron microscope operators need to care about stability of the room temperature where the electron microscope is located(A typical electron microscope room temperature specification is 20° C. and a variation of maximum ±0.1° C.). A stability near 0.1° C. level is usually desired for high resolution work. Although operators attempt to keep a constant temperature of the electron microscope room as long as possible, it is generally difficult to keep a typical electron microscope room temperature specification being 20° C. and a variation of maximum ±0.1° C.

Further on, practically using an electron microscope with above conditions is very difficult and extensive room temperature stabilizer equipment is needed. Although a constant temperature is required in the electron microscope room, people entering the electron microscope room and for example opening a door, inserting and retracting specimens, operating the microscope inside the room, change of heat value depending on the number of the people in the room affect the temperature, making it impossible to constantly keep the desired level of 20° C. and a variation of maximum ±0.1° C.

Furthermore, the heating effect of the human body while operating the electron microscope and disturbance of air flow inside the room when people are moving, cause disturbance of the temperature near the goniometer area where the specimen holder is inserted. This disturbance is decreasing the performance of the electron microscope.

Recently, electron microscopes such as TEM and STEM are used in research institutions as well as nanotechnology industry that sometimes incorporate use in production lines. However, for the latter productivity, high data throughput of electron microscopes are directly related to efficiency of these production lines. Specimens are mounted onto the specimen holder which is located in ambient room temperature. Therefore, the temperature of the main body of the specimen holder depends on the room temperature. Then the holder is inserted into the electron microscope giving the specimen holder a different ambient temperature and the thermal expansion or retraction of the specimen holder will cause a drift of the specimen in the x-direction. That is, the temperature of main body of the specimen holder in the room is shifted to that in the electron microscope. A result of this is that the electron microscope operator needs to wait until this drift become stabilized enough for reaching desired performance. Because this temperature shift causes an thermal expanding of items, such as point of action of X-axis movement of the specimen holder of the goniometer stage, item for fixing a specimen, that is, items located in X-axis movement remote interval area, thereby causing the specimen drift, as a result, it is impossible to obtain data. As the electron microscope is used as an industrial production tool as well as a tool for research applications, higher throughput and minimal waiting time is important and is indeed a serious issue for electron microscope users. A sample holder that can function with reduced specimen drift resulting in higher productivity is until now unknown.

Therefore, it is an object of the present disclosure to provide a specimen holder making it possible to reduce waiting time until the data can be obtained in the electron microscope and increase productivity.

SUMMARY

To be able to solve the above-mentioned problems, the inventor discovered as a result of extensive examination regarding suitable parts, suitable design and construction methods for a specimen holder movement device by means of the use of various sorts of materials as a material for the electron microscope such as main body materials of the specimen holder in a longitudinal direction, or a pipe material for holding the specimen holder, in order to reduce a specimen drift generating immediately after equipping the specimen holder to the electron microscope.

That is, the present disclosure is a specimen holder wherein the main body material of the specimen holder is made of or partly made of low thermal expansion coefficient material.

In a preferred embodiment of the specimen holder according to the present disclosure, the specimen holder is characterized in that the low thermal expansion coefficient material comprises any elements belonging to group 4, 5 or 6 in the periodic table of the elements.

In a preferred embodiment of the specimen holder according to the present disclosure, the specimen holder is characterized in that the low thermal expansion coefficient material is made by any elements belonging to group 6 in the periodic table of the elements.

In a preferred embodiment of the specimen holder according to the present disclosure, the specimen holder is characterized in that the low thermal expansion coefficient material comprises tungsten or a tungsten based alloy.

In a preferred embodiment of the specimen holder according to the present disclosure, the specimen holder is characterized in that the low thermal expansion coefficient material is designed without using lead.

In a preferred embodiment of the specimen holder according to the present disclosure, the specimen holder is characterized in that an alloy including tungsten is a 94W-4Ni-2Cu or 94W-2Ni-2Cu.

The specimen holder movement device according to the present disclosure is characterized by a specimen holder movement device having a specimen holder according to the present disclosure.

Furthermore, in a preferred embodiment of the specimen holder movement device according to the present disclosure, the specimen holder movement device is characterized in that the main material of a tube or a pipe for holding the specimen holder is made of or partly made of low thermal expansion coefficient material.

The specimen holder and the specimen holder movement device of the present disclosure have advantage effects that the disclosure makes it possible to drastically reduce waiting time until the data can be obtained in the electron microscope for user of the electron microscope. That is, this disclosure, a specimen holder or its movement mechanism, made partly of material with low thermal expansion coefficient is characterized by using tungsten material or such to reduce expansion in along the x-axis of the specimen holder providing the result that when the specimen holder described is inserted into an electron microscope specimen drift as mentioned above is reduced. The temperature inside the electron microscope is generally higher than the ambient room temperature. The specimen is mounted onto the specimen holder when the specimen holder is located in ambient room temperature. When the specimen holder is inserted into the electron microscope having a higher ambient temperature the temperature of the specimen holder itself rise, specimen drift as mentioned above (which is generated by thermal expanding thereby drifting the position of a specimen in a longitudinal direction) will occur until the temperature of the specimen holder equals its ambient temperature. This disclosure is partly made of low thermal expansion material allowing the waiting time until data acquisition can begin is significantly shortened.

Furthermore, the specimen holder and the specimen holder movement device of the present disclosure are characterized by being made partly of low thermal expansion material. Therefore, they have advantage effects that the use of low thermal expansion material, especially, tungsten makes it possible to avoid using lead for shield of a leakage X-ray. If the main body of the specimen holder itself is being partly made of tungsten it has another advantage, namely reducing dangerous x-rays passing through it giving the result that it is not necessary to shield for x-rays by other means.

Furthermore, according to a specimen holder and a specimen holder movement device of the present disclosure, they are characterized by achieving fast and stable data acquisition for electron microscopes. Since a specific heat of a low thermal expansion material used as a material of a main axis of a body of a specimen holder in a longitudinal direction is high, and therefore, compared to a specimen holders used now which are made of brass, phosphor bronze, aluminum or non-magnetic stainless steel, the present disclosure makes it possible to reduce a specimen drift depending on a small temperature change and occurring until the temperature of the specimen holder equals its ambient temperature inside the electron microscope column after mounting the specimen holder to the electron microscope, and to obtain fast and stable data acquisition.

Further, as a low thermal expansion material, especially a low thermal expansion material comprising molybdenum or tungsten as main material which is used as a material of a main axis of the body of specimen holder in a longitudinal direction, or a specimen holder movement device such as a pipe for holding a specimen holder, is high dense than that of brass, phosphor bronze, aluminum or non-magnetic stainless steel which are used in the prior art, instead of these using the low thermal expansion material such as tungsten or molybdenum provides a smaller amount of thermal expansion when ambient temperature changes as shown in table 2.

Therefore, the present inversion has an advantage effect that it makes it possible to obtain fast and stable data acquisition. A specimen holders used now made of brass, phosphor bronze, aluminum or non-magnetic stainless steel described as SUS304 in table 2 gives a high specimen drift due to thermal expansion when upon insertion or when ambient room temperature fluctuates. On the other hand, The present disclosure suggests that such as HAC1 as low thermal expansion material is used instead to minimize thermal expansion which allows specimen drift to be reduced down to one sixth for the purpose of fast and stable date acquisition.

(Criterion 1: It is assumed that the specimen holder made of Tungsten alloy needs 1 hour to reach 1 nm per minute specimen drift rate. Criterion 2: It is assumed that the total length of the specimen holder in x-axis direction is 10 cm (100 mm). Criterion 3: It is assumed that in the case of mounting the specimen holder into an electron microscope, the original specimen holder temperature is 20° C. ♦: Specimen holder made of HAC1 Tungsten alloy. ●: Specimen holder made of Phosphor bronze.

Description of Embodiments

First of all, the present disclosure is a specimen holder, such as a main body in the x-axis, partly made of low thermal expansion material to reduce material expansion of the specimen holder itself in the x-axis direction causing specimen drift immediately after it is inserted into an electron microscope. The explanation of the mechanism and means of reducing specimen drift is explained as follows.

Figure 1:
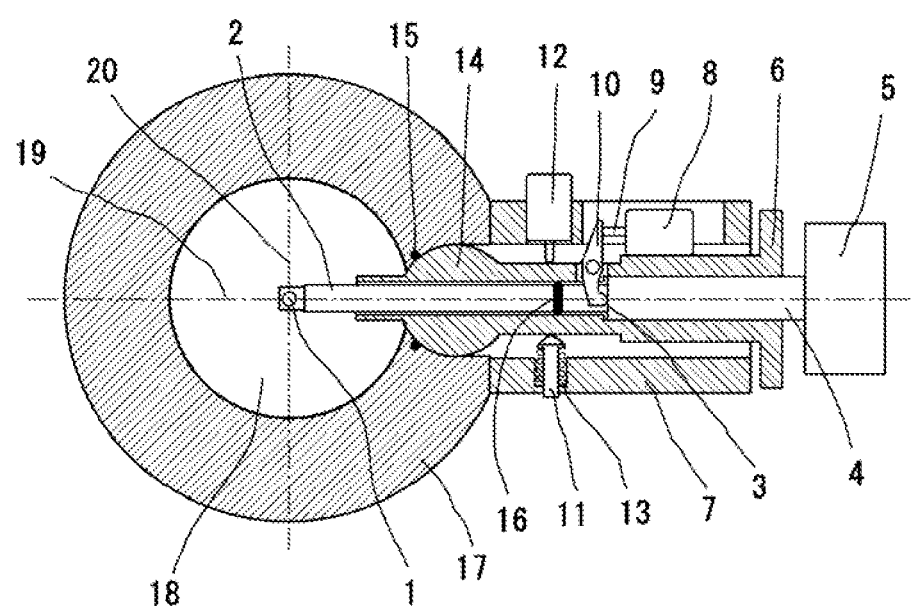
FIG. 1 shows a schematically graph of a constitution of a specimen holder inserted into an electron microscope with the goniometer stage.

The electron microscope with its electron beam is equipped with a goniometer stage or such where the specimen holder is inserted as shown in FIG. 1. The specimen holder is inserted into a pipe 6 for holding the specimen holder in the goniometer stage; the x axis movement mechanism 8, 9 and 10 of the goniometer stage allows specimen holder 2 and 4 to be shifted and the link between these two parts occurs at position (movement transmission receiving potion) 3. The electron beam (intersection of 19 and 20) hits the specimen 1 resulting in the field of observation. The field of observation in the x-axis direction depends on the position 3 and the length of the specimen holder part 2. That is, between point 3 of action of X-axis movement of the specimen holder and position of specimen 1, there is an item (the specimen holder part) 2 which is a part of a main body of the specimen holder (that is area between point 3 of action of X-axis movement of the specimen holder and position of specimen 1 is also referred to as X-axis movement remote interval area.). It is desired to limit the effects of thermal expansion of specimen holder part 2.

Figure 2:
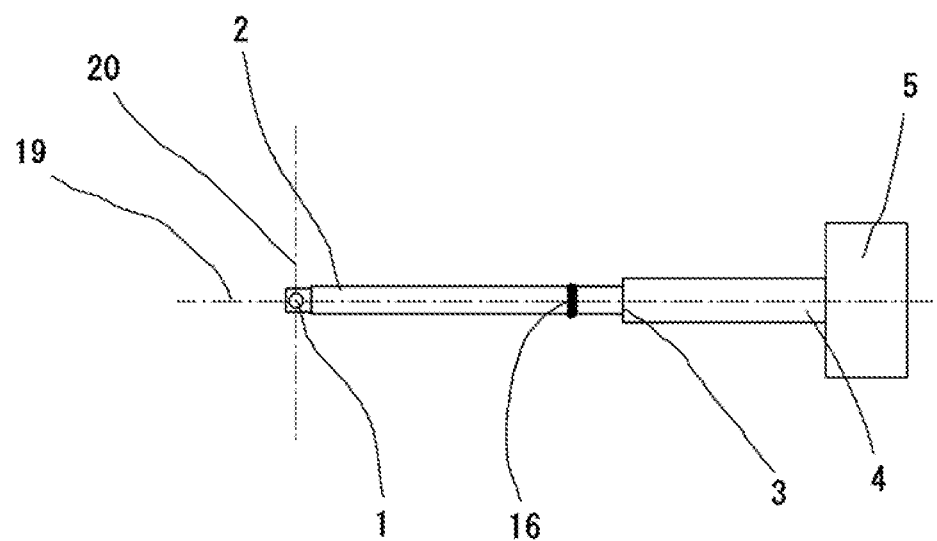
FIG. 2 shows a schematically graph of a specimen holder in an embodiment of the present disclosure as an example.

Therefore, for example, as shown in FIG. 2 the position of the specimen 1 in the x-direction depends upon the controllable position of 3 and the length of an item 2 which depends on material expansion. This material expansion causing specimen drift is desired to be minimized, that might be done by using material with low expansion coefficient like tungsten or such for the item 2 existing between point 3 of action of X-axis movement of the specimen holder and position of specimen 1. The present disclosure solves the problem with specimen drift to a great extent for the purpose of reducing waiting time before data acquisition amongst electron microscope users.

Namely, The present disclosure, a specimen holder or its movement device, is partly made of material with low thermal expansion coefficient. Compared to specimen holders used now the disclosure uses materials with lower thermal expansion coefficient for the purpose of reducing the thermal expansion effects. The material with low thermal expansion coefficient means that its thermal expansion coefficient used for the present disclosure is lower than that of materials used in the prior art for the main axis of the body of the specimen holder. Further, a specimen holder used in an electron microscope will affect the shape and position of the electron beam passing through the specimen unless the specimen holder is made of non-magnetic material. Hence, because of the Lorentz force (the Lorentz force is the force on a point charge due to electromagnetic fields) it is required that a specimen holder is made of a non-magnetic material. That is, if there are inhomogeneous magnetic field in an area of the specimen holder, the electron beam passing through the specimen will be affected by the Lorentz force, thereby it being impossible to obtain an accurate data. Therefore the available materials for constructing specimen holders are limited, some available materials are listed in table 1; table 1 also describes the linear thermal expansion comparison between these materials.

TABLE 1

| Material Name | Thermal expansion (linear) |
| --- | --- |
| Aluminum | $23.1 \times 10^{-6}/K$ |
| Duralumin | $21.6 \times 10^{-6}/K$ |
| Brass | $17.5 \times 10^{-6}/K$ |
| Copper | $16.5 \times 10^{-6}/K$ |
| Stainless steel | $14.7 \times 10^{-6}/K$ |
| Phosphor bronze | $17.8\text{-}18.2 \times 10^{-6}/K$ |
| Tungsten alloy HAC1 | $5.0 \times 10^{-6}/K$ |
| Tungsten alloy HAC2 | $5.5 \times 10^{-6}/K$ |

The first five rows of table 1 are based on information from public scientific tables (2007 version). Row six of table 1 is based on information (a solid state propertie table) published by Metal industry corporation (Kiyomine metal industry Co., Ltd.).

The last two rows of table 1 are based on information (a solid state propertie table) published by Nippon Tungsten Co. Ltd (Tungsten alloy HAC1 composition 97W-2Ni-1Cu or Tungsten alloy HAC2 composition 94W-4Ni-2Cu). Note that data in table 1 may differ slightly depending on different material suppliers.

The main axis materials of the body of specimen holders used now are generally made of brass, phosphor bronze, aluminum or non-magnetic stainless steel. These are all materials that continue to expand with increasing temperature and they are having a positive coefficient of expansion. For the purpose of reducing specimen drift immediately after the specimen holder is inserted into an electron microscope goniometer, it is desired to construct the specimen holder with material with low thermal expansion coefficient instead. Referring to FIG. 1 the distance between x-axis mechanism point 3 and the specimen 1 the distance change due to temperature is desired to be reduced. This disclosure tries to minimize the problem with specimen drift by using a lower thermal coefficient material for the main body of the specimen holder etc.

The present disclosure may be a specimen holder, made partly of lower thermal expansion coefficient material than stainless steel which is commonly used as construction material of the specimen holder critical parts as described above. In the periodic table of the elements the construction material used can be any belonging to group 4, 5 or 6. Preferably the present disclosure would use materials belonging to group 4, 5 and 6, namely chromium, molybdenum, tungsten, vanadium, niobium, titanium, zirconium or similar materials.

The low thermal expansion coefficient material described above can preferably comprise elements within periodic table of the elements group 6, especially Tungsten or a Tungsten alloy is suitable as main component. It is not intended to limit the main component to a tungsten alloy as other low thermal expansion coefficient materials might be suitable for the present disclosure. It is clear that the conditions do require a specimen holder which is non-magnetic and it is suggested to use tungsten as main component although it may contain secondary components even as an impurity. In short, the material can be any alloy that can achieve lower thermal expansion than materials commonly used for specimen holders now.

As an additional positive embodiment of the present disclosure although the low thermal expansion materials described are lead free they have a good x-ray blocking function, especially, in the case of the use of tungsten because tungsten have a good x-ray blocking function compared with lead. Although traditionally lead was used to prevent x-ray leakage, the present disclosure is able to provide a specimen holder with no use of lead. In particular the tungsten alloys 97W-2Ni-1Cu or 94W-4Ni-2Cu both efficiently blocks x-rays.

Here follows a description of the pipe (hereinafter referred to as insertion pipe) for holding the specimen holder of the present disclosure where the disclosure, a specimen holder, is aimed to be inserted. Different from a traditional insertion pipe the present disclosure is characterized by the possibility to use an insertion pipe made of low thermal expansion material. The advantage is that it will reduce specimen drift to occur due to temperature changes in the air near the goniometer of the electron microscope even after temperature reached equilibrium inside the electron microscope containing a specimen holder. Referring to FIG. 1 the suggestion is for the purpose of minimizing any shift at position 3 (depending on the position of item 10 which is mounted on the insertion pipe described) which would cause a shift of the specimen position 1. That is, stabilization of the position 3 makes it possible to reduce the specimen drift to occur due to even small temperature changes between the air near the goniometer of the electron microscope and the room temperature where a specimen is mounted to the specimen hold.

Inside the electron microscope the electron beam is passing through the specimen mounted onto the specimen holder which is inserted into the goniometer, meaning that the specimen holder fits and is kept in place by the insertion pipe. This is shown in detail in FIG. 1 and is further explained as follows referring to FIG. 1. The specimen holder 2 and 4 is mounted into insertion pipe 6 for holding the specimen holder, the x-axis movement mechanism 8, 9 and 10 can cause a shift of the specimen holder 2 and 4 linked at position 3. This shift of position 3 results in that the specimen holder shifts which results in that the specimen 1 shifts, relative to the electron beam passing through position in the intersection of 19 and 20, and the field of observation can be shifted. At this moment, the x-axis movement mechanism part 10 is mounted on the insertion pipe 6. Because part 10 is mounted on insertion pipe 6 temperature fluctuations causing thermal expansion or contraction of insertion pipe 6 will result in an undesired shift of position 3. This shift of position 3 will then cause undesired shift of the specimen holder 2 resulting with a specimen 1 shift, relative to the electron beam passing through position in the intersection of 19 and 20. The goniometer with the x-axis movement device 8, 9 and 10 is used to shift the specimen 1 and it is desired that the thermal expansion or retraction of insertion pipe 6 is as small as possible. That is, it is desired that materials used for the specimen holder movement device such as insertion pipe 6 for holding the specimen holder where the x-axis movement mechanisms 8, 9, 10 etc., in the goniometer stage are mounted to, are also a material that the thermal expansion or retraction is as small as possible.

Therefore the present inventor finds that materials used for the specimen holder movement device such as the goniometer insertion pipe can be made of low thermal expansion material for the purpose of minimizing the unwanted thermal expansion or contraction caused by ambient temperature fluctuations.

That is, the present disclosure is characterized by constructing an insertion pipe with materials with lower thermal expansion coefficient than conventional insertion pipes used now. That is, a material with the low thermal expansion coefficient means that the material has lower thermal expansion coefficient than that of the prior art.

A material used for the specimen holder movement device such as insertion pipes for holding the specimen holder used now are generally made of brass, phosphor bronze, aluminum or non-magnetic stainless steel. These are all materials that continue to expand with increasing temperature and they are having a positive coefficient of expansion. For the purpose of reducing specimen drift, it is desired to construct the insertion pipe with material having low thermal expansion coefficient.

In the present disclosure, as the materials used for the specimen holder movement device such as insertion pipes for holding the specimen holder, it is possible to use the materials having the lower thermal expansion coefficient material than stainless steel which is commonly used as construction material for the insertion pipe. In preferable embodiment, in the periodic table of the elements the construction material used can be any belonging to group 4, 5 or 6. Preferably the present disclosure would use materials belonging to group 4, 5, 6, namely chromium, molybdenum, tungsten, vanadium, niobium, titanium, zirconium or similar materials.

For the present disclosure, an insertion pipe, the low thermal expansion coefficient material described above is preferably within periodic table of the elements group 6, especially Tungsten or a Tungsten alloy is suitable as main component. It is not intended to limit the main component to a tungsten alloy as other low thermal expansion coefficient materials might be suitable for the present disclosure. It is clear that the conditions do require an insertion pipe which is non-magnetic and it is suggested to use tungsten as main component although it may contain secondary components even as an impurity. In short, the material can be any alloy that can achieve lower thermal expansion than materials commonly used for insertion pipes now.

In the preferable embodiment, as an additional positive result of the present disclosure although the low thermal expansion materials described are lead free they have a good x-ray blocking function. Traditionally lead was used to prevent x-ray leakage. In the present disclosure, it is possible to produce a specimen holder with no use of lead because in the case of the use of tungsten as the low thermal expansion material, it has a good x-ray blocking function than lead. From a viewpoint that it is easy to form, in the preferable embodiment, in particular, the tungsten alloys 97W-2Ni-1Cu or 94W-4Ni-2Cu can be used which both efficiently blocks x-rays.

Next, a description of the specimen holder movement device or mechanism of the present disclosure referring to FIG. 1 follows here. The specimen holder movement mechanism or device to be described uses the specimen holder of the present disclosure, details are described above. The specimen movement device of the present disclosure can include, for example, desired body 8 of the actuator for x-axis movement mechanism, a pin 9 for driving the specimen holder mounted to the body 8 of the actuator for x-axis movement mechanism, link item 10 for transmitting the power from the actuator to the x-axis in order to shift the specimen holder on the x-axis, etc. Or the specimen movement device of the present disclosure can include, a desired member 11 for pushing back the pipe for holding the specimen holder pushed by the y-axis movement device, a body 12 of the actuator for y-axis movement mechanism, a spring 13 for the member 11 for pushing back the pipe, a member 14 for pivot mechanism for a pipe for holding specimen holder movement etc. The x-axis direction movement mechanism or device uses the actuator 8, when its position is altered it will cause a position shift of the pin 9. The pin 9 is then linked to the specimen holder via part 10. The y-axis direction movement mechanism uses the actuator 12, when its position is altered the pin of the actuator itself will cause a shift of insertion pipe 6 resulting in a shift of the specimen holder around its pivot located at position 14. The y-axis reverse movement is forced by spring 13 where it force is transferred to insertion pipe 6 via the pin 11. Position control of the specimen holder in the x-axis direction is done by controlling the position of the actuator 8 which will link its position via pin 9 and shaft 10. Position control of the specimen holder in the y-axis direction is done by controlling the position of the actuator 12 and is forced in the reverse direction by spring 13 and pin 11.

Furthermore, in the preferable embodiment of the specimen movement device of the present disclosure, the main parts used for the specimen movement mechanism such as the pipe for holding the specimen holder are characterized by being made of low thermal expansion material. The reasons are the same as for using low thermal expansion material when constructing the specimen holder and insertion pipe of the present disclosure. The specimen holder and insertion pipe of the present disclosure are described in detail above, can be referred in the specimen movement device or mechanism of the present disclosure.

In the present disclosure, a specimen holder and insertion pipe, is characterized by that additional parts concerning specimen movement may also be made of low thermal expansion coefficient materials such as tungsten. Referring to FIG. 1 these additional parts are the goniometer housing (main frame member) 7 or part of the electron microscope column 17 etc. The y-axis direction and z-axis direction movement mechanisms are generally built into the goniometer housing 7. The design example in FIG. 1 show that the y-axis direction actuator 12 is mounted into housing 7, therefore thermal expansion or contraction of 7 will shift the position of insertion pipe 6 resulting in a shift of the specimen holder 2 and specimen position 1 via the pivot located at position 14.

The z-axis direction movement mechanism has the same design as the y-direction movement mechanism although the z-axis direction movement mechanism is rotated 90 degrees relative to axis 19 in FIG. 1. The conclusion concerning the z-axis mechanism construction material choice is the same as for the y-axis.

Regarding the electron microscope column part 17, the pole piece, non-magnetic centering spacers for the pole piece and parts for controlling the field inside the electromagnetic lens mounted together with part 17 are omitted in FIG. 1. In fact, a pole piece, spacers and parts for controlling the magnetic field and others are generally mounted (inside or outside) together with the electron microscope column part 17. Depending upon the type of electron microscope the location of item 17 might differ and might be located inside or outside etc., this example shows a design where the objective lens coil is outside and the pole piece is inside and the electron beam pass inside vacuum through the intersection of 19 and 20. The non-magnetic spacers for centering the pole piece as well as magnetic conductive parts are mounted together with part 17 of the electron microscope. For example, in the case that the position of the electron microscope column part 17 is outside, an explanation of the surrounding constitution of the objective lens of the electron microscope column part 17 is as follows. There are an electron pathway and pole piece in the center (the intersection of 19 and 20) of a vacuum section. Outside of these section, there are parts for controlling the magnetic field through the intermediation of non-magnetic spacers for centering the pole piece. Further outside of these section, there is the electron microscope column part 17 as a body tube.

As mentioned in previous point, regardless if the mentioned parts are mounted inside or outside the electron microscope column 17 as well as the location of itself may vary the present disclosure can be implemented for any case. If the location for mounting the mechanism 14 is inside, between or outside the influence of thermal expansion or contraction of the part 17 will shift the radial position of mechanism 14. The result of a mechanical shift of item 14 is that insertion pipe 6 holding the specimen holder will be shifted. Thus there is a benefit that electron microscope column 17 partly is made of low thermal expansion coefficient material such as tungsten.

Moreover, referring to FIG. 1, the electron microscope column part 17 is suggested to be made fully or partly of low thermal expansion coefficient material for the purpose of a stable mounting point for the pivot mechanism 14. Item 14 as well is suggested to be made fully or partly of low thermal expansion coefficient material.

Moreover, as shown in FIG. 1 and FIG. 2, the x-axis direction shaft is indicated as a cylindrical shaft but a triangle, square or other shape would be a possible design. The present disclosure is not limited to the shape described in these 2 figures (mechanical drawings). That is, the present disclosure is not particularly limited to specific shape with some cross section of the axis or specific cross-section area of the axis.

Further, referring to FIG. 2, the present disclosure, a specimen holder is made partly of low thermal expansion coefficient material, particularly item 2 as it is between the x-axis direction movement mechanism which is linked via position 3 and the specimen 1 position. Using low thermal expansion coefficient material for the items 3, 4 and 5 would not cause any problem and the present disclosure is not limited to use of low thermal expansion coefficient material for item 2.

The examples of the present disclosure were explained in detail with aid of figures attached. However it is hereby stated that the present disclosure is not limited by the concept described in the figures.

EXAMPLES

Hereinafter, the detailed description of this disclosure is done further. The examples given are intended to be interpreted in a way that this disclosure is not limited by the concepts described.

Example 1

At first, the present disclosure is a specimen holder, in the x-axis direction the main body is partly made of low thermal expansion material for example tungsten. The use of tungsten, due to the low thermal expansion, will reduce occurrence of specimen drift immediately after the specimen holder is inserted into the electron microscope. The reduction of specimen drift has been confirmed by testing a specimen holder as describe inside an electron microscope.

A specimen was actually mounted onto a specimen holder in ambient temperature of around 20° C. then the specimen holder was inserted into an electron microscope where the specimen holder ambient temperature is estimated to be around 40° C. Due to the specimen holder ambient temperature change from 20° C. to 40° C. thermal expansion in the x-axis direction was observed and tests were performed for finding decrement in length expansion of the specimen holder. The process of constructing a specimen holder made partly of tungsten uses known conventional methods.

Amongst materials generally used making currently available specimen holders one is phosphor bronze and it is used for comparison. The length expansion coefficient for a phosphor bronze specimen holder in the range 20° C. to 40° C. is calculated to be 15 micrometer per degree Celsius ($\alpha$=15 $\mu$m/° C.).

In contrast, the tungsten alloy suggested for the present disclosure is calculated to be 5 micrometer per degree Celsius ($\alpha$=5 $\mu$m/° C.).

Therefore, compared to specimen holders most commonly used until now made of phosphor bronze it would be possible to reduce length expansion with one third. By the item 2 of FIG. 1 being made of tungsten a significant reduction of specimen drift was confirmed.

Amongst TEM there are a large variety of models and difference in performance is large. Therefore, depending upon installation environment TEM with the same specific specification will perform differently.

On the other hand, data acquisition with TEM may be with aid of negative film exposure, a Charge Coupled Device Image Sensor (Hereinafter referred to as CCD) or others. The most commonly used CCD is usually operated with an exposure time of about 1 second although depending upon magnification, electron beam density and thickness of the specimen the exposure time may be different. The question is how much specimen shift during a specific shutter opening time would result in a blurred image and what is that limit? Recent CCD cameras have improved performance compared to older ones but often exposure time may not be shortened.

Therefore, the theoretical explanation and the need of reducing specimen drift with the present disclosure follow here. A typical, commonly used, CCD camera has 1024×1024 pixels with a size of 1 square inch. Hence the size of one pixel is 24.8 micrometer and the conclusion is that a drift of less than 24.8 micrometer on the CCD surface will not cause any reduction of image quality.

As an example, with the electron microscope used with a 10,000 times (10 KX) magnifying condition the above definition require an actual specimen drift of less than 2.48 nanometer. For the CCD camera exposure time 1 second (most commonly used) the specimen drift rate of less than about 150 nanometer per minute is required. The graph in FIG. 4 shows a theoretical comparison (attenuation table of the specimen drift) between a specimen holder made of phosphor bronze and a specimen holder (with lower drift rate) made of tungsten alloy.

Figure 4:
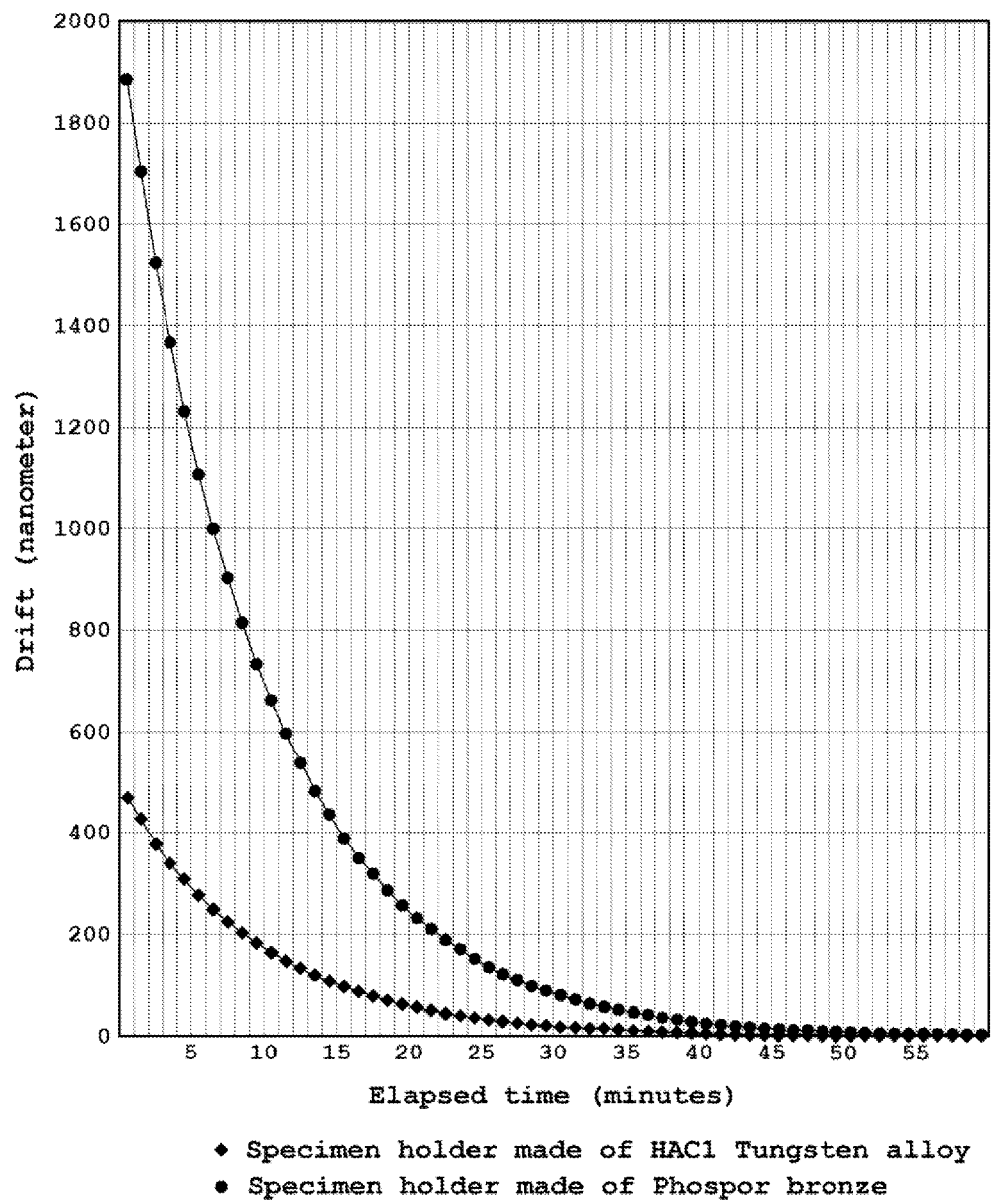
FIG. 4 shows an attenuation (estimated theoretical value) of the specimen drift comparison between a specimen holder made of Tungsten alloy (Tungsten alloy HAC1 composition 97W-2Ni-1Cu or Tungsten alloy HAC2 composition 94W-4Ni-2Cu) and a specimen holder made of Phosphor bronze. The vertical axis is the amount of drift (nm) and the horizontal axis is the time after the specimen holder is inserted into the electron microscope (minuite).

Observing the graph in FIG. 4 the following conclusion can be made. The time for reaching a drift rate less than about 150 nanometer per minute with a specimen holder made of phosphor bronze is about 25 minutes. The time for reaching a stable enough drift rate (less than 150 nanometer per minute) with a specimen holder made of tungsten alloy HAC1 is about 12 minutes.

Therefore, it is concluded that compared with conventional materials about half of the waiting time can be reached.

Moreover, regarding the graph in FIG. 4 showing theoretical drift rates it is additionally explained as follows. (1) It is assumed that the time for reaching a stable drift rate of less than 1 nanometer per minute is about 60 minutes. (2) It is assumed that the distance between the x-axis movement mechanism link of the specimen holder and the specimen is 10 centimeter (100 millimeter). (3) The temperature of the specimen holder is assumed to be 20° C. at the time of insertion into the electron microscope.

Regarding the graph in FIG. 4 showing theoretical drift rates, the drift rate of a phosphor bronze specimen holder after 1 hour waiting time is about between 4 nanometer and 5 nanometer and that is not much different from actual experiments performed.

This simulation, regarding the present disclosure which is a specimen holder, shows the following advantages. To reach the same drift rate takes about half of the time and then the result seem to reach less than one fourth of drift rate if it is the same time.

Moreover, the tungsten material used for this disclosure is "Heavy alloy" and it was developed by Nippon Tungsten Co Ltd. The "Heavy Alloy" is a high density tungsten-based sintered heavy alloy with composition 97W-2Ni-1Cu or composition 94W-4Ni-2Cu. Commonly used tungsten materials oxidizes easily and the materials are difficult to cut and machine. The "Heavy alloy" has excellent resistance to oxidation and can be machined into various shapes including precision machining required for use with the present disclosure. It is possible to use parts of the specimen holder which are required for machining accuracy. The present disclosure is not limited to use the product "heavy alloy" produced by Nippon Tungsten Co Ltd.

Moreover, for the present disclosure, in order to reduce the length expansion in the x-axis direction suitable materials are suggested but the present disclosure is not limited to be designed with these materials, for example, the number of the used member of the specimen holder.

Example 2

Next, regarding x-rays generated at the specimen position or area near the specimen, suitable low thermal expansion material for blocking and preventing leakage of such x-rays were investigated.

Figure 3:
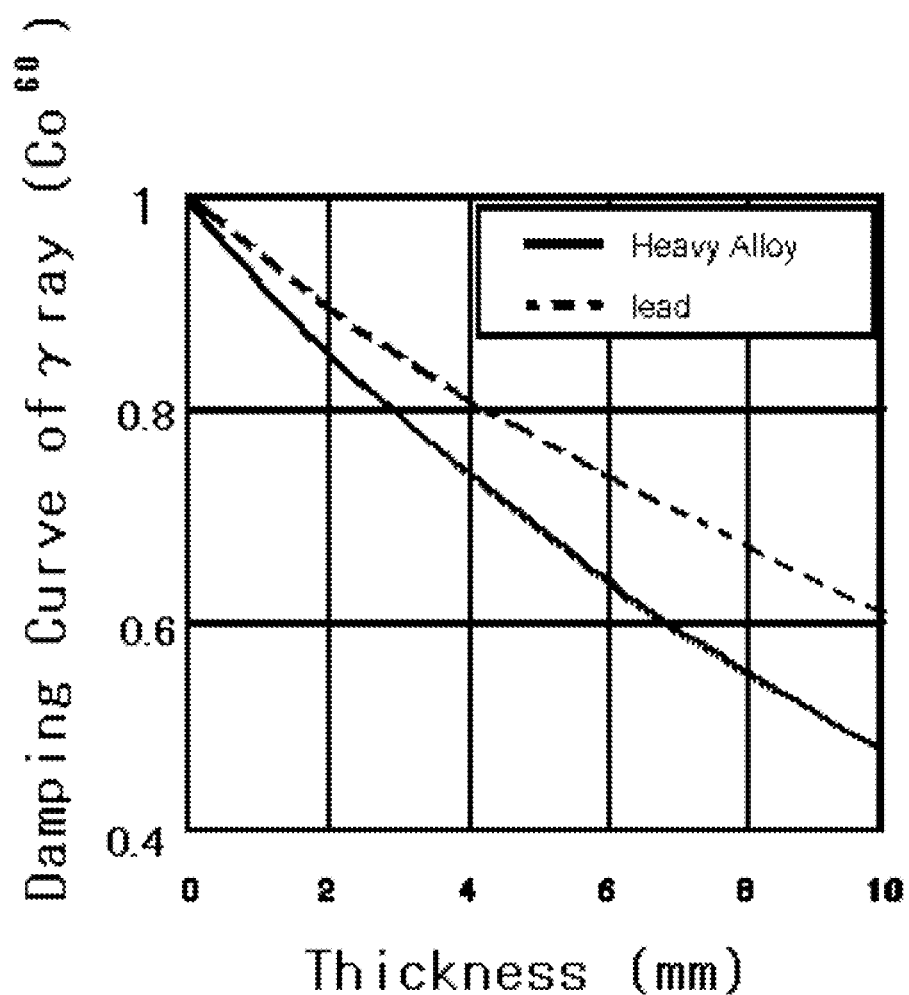
FIG. 3 shows a Gamma Radiation attenuation ratio comparison between Tungsten and Lead. The vertical axis line is a Gamma Radiation attenuation ratio ($Co^{60}$) and the horizontal axis is thickness of shielding material (mm).

To be specific tungsten was investigated as it is a low thermal expansion material. As shown in FIG. 3, lead and tungsten "Heavy alloy" is compared regarding gamma-ray attenuation ratio. The conclusion of the graph in FIG. 3 is that tungsten has a better X-ray shielding ability than lead. Therefore, it was revealed that standard specimen holders used until now needs lead or similar as a shield against x-rays generated when an electron beam hits areas near the specimen but for the present disclosure adding lead as x-ray shield is not needed.

Example 3

Next, for the present disclosure, main axis material of the specimen holder, or an insertion pipe, various materials were evaluated. The design material was selected with main consideration for actual amount of thermal expansion, especially at temperature variations near room temperature. That is, referring to drawing 1 the insertion pipe 6 of the specimen holder is made of tungsten for this case. An investigation was done where changes in temperature of the movement link part 10 near movement transfer position 3 was evaluated. It was investigated if even small ambient room temperature variations would affect specimen drift rate.

Table 2 shows characteristic properties of materials. Room temperature variations correlation to actual amount of thermal expansion was investigated.

TABLE 2

| Material | Density (g/cm$^3$) | Specific heat capacity (J/g × K) | Thermal expansion (m/K) |
| --- | --- | --- | --- |
| SUS304 | 7.93 | 0.59 | 17.3 |
| HAC1 | 18.5 | 0.146 | 5 |

SUS304 is a commonly used austenitic stainless steel (typical composition of SUS304: Bal.Fe 18.00-20.00Cr 8.00-10.50Ni≤0.08C≤1.00Si≤2.00Mn≤0.045P≤0.030S. Note that there are many grades other than the example manufacturers products) and HAC1 is a tungsten alloy (97W-2Ni-1Cu), a comparison is shown in table 2.

Comparing the above materials, concerning thermal expansion due to temperature variations, the following calculation supports the expected results.

Amount of thermal expansion due to temperature variation=[Density]×[Specific heat capacity]× [Thermal expansion]=[J]×[m/cm$^3$]×[K$^2$].

Note 1: The shape and the volume (cm$^3$) of the material is the same. Note 2: Average ambient temperature (room temperature) conditions are the same with same fluctuations. Note 3: The material is shaped in the same way and the surface area is equal, therefore heat exchange efficiency is the same for both.

Material $A$ against Material $B$=[J]×[m/cm$^3$]×[K$^2$] against [J]×[m/cm$^3$]×[K$^2$].

The result of comparing HAC1 against SUS304 follows here.

HAC1 against SUS 304=18.5×0.146×5.0 against 7.93×0.59×17.3=13.51 against 80.94=1 against 5.99

Hence it is revealed that the amount of thermal expansion with respect to temperature change, comparing traditionally used materials such as SUS304 the thermal expansion is estimated to be possible to reduce with one sixth or the factor 0.17 by using HAC1.

The above result shows that ambient temperature fluctuations are causing specimen drift via the movement link position 3 in FIG. 1. By using low thermal expansion material when constructing the materials such as the specimen holder insertion pipe the disturbance caused by ambient temperature fluctuations can be reduced. This will allow the important benefit of faster and more stable data acquisition.

Industrial Applicability

Recently performances of electron microscopes improved and they are often used in research institutions as well as nanotechnology industry that sometimes include use in production lines. Especially for the nanotechnology industry productivity and high data throughput of electron microscopes are directly related to efficiency of production.

The waiting time from mounting a specimen onto a specimen holder and inserting it into the electron microscope until it is possible to acquire high quality data is of the highest importance. However, with a conventional specimen holder this waiting time is long due to specimen drift. By using a specimen holder made of tungsten the thermal expansion is small and specimen drift is reduced and waiting time until it is possible to acquire high quality data is significantly reduced. The desired high data throughput of an electron microscope is made available.

REFERENCE NUMBERS IN DRAWINGS

1. Specimen (The position where the specimen is mounted)
2. Part of specimen holder in X-axis between movement device and specimen
3. X-axis movement force (transmission surface) from goniometer to specimen holder transfer position
4. Longer axis of the specimen holder
5. Handle of the specimen holder
6. Insertion pipe for holding the specimen holder
7. Goniometer housing (main frame member) (X, Y and Z movement mechanisms mounted to this)
8. Actuator for X-axis movement mechanism
9. Pin for feeding force from actuator to movement mechanism
10. Part for linking force between specimen holder X-axis and actuator with its pin
11. A member for pushing back the insertion pipe for holding the specimen holder bushed by Y-axis movement mechanism
12. Actuator for Y-axis movement mechanism
13. A pushback spring for the member for pushing back the insertion pipe
14. Pivot mechanism member for the insertion pipe of the specimen holder
15. Vacuum seal member for pivot mechanism member (o-ring)
16. Vacuum seal member for specimen holder (o-ring)
17. Electron microscope column part
18. Area inside electron microscope which is under vacuum
19. X-axis (longer axis of the specimen holder)
20. Y-axis

What is claimed is:

1. A specimen holder comprising:
   a transmission surface point,
   a position where a specimen is mounted,
   a X-axis movement remote interval area located between the transmission surface point and the position where the specimen is mounted,
   a specimen holder portion extending from the transmission surface point on a side of the transmission surface point that is opposite the position where the specimen is mounted,
   wherein the transmission surface point is linked to a X-axis direction movement mechanism of the specimen which can transfer a X-axis movement force from a goniometer to the X-axis movement remote interval area, wherein the X-axis movement remote interval area in the main body material of the specimen holder is made of a low thermal expansion coefficient material.

2. A specimen holder according to claim 1, wherein the low thermal expansion coefficient material comprises any elements belonging to group 4, 5 or 6 in the periodic table of the elements.

3. A specimen holder according to claim 1, wherein the low thermal expansion coefficient material is made by any elements belonging to group 6 in the periodic table of the elements.

4. A specimen holder according to claim 1, wherein the low thermal expansion coefficient material comprises tungsten or a tungsten based alloy.

5. A specimen holder according to claim 1, wherein the low thermal expansion coefficient material is designed without using lead.

6. A specimen holder according to claim 1, wherein an alloy including tungsten is a 94W-4Ni-2Cu or 94W-2Ni-2Cu.

7. A specimen holder movement device having a specimen holder according to claim 1.

8. A specimen holder movement device according to claim 7, wherein the main material of a tube for holding the specimen holder is made of a low thermal expansion coefficient material.

* * * * *